United States Patent [19]

Bock et al.

[11] Patent Number: 4,489,146
[45] Date of Patent: Dec. 18, 1984

[54] REVERSE PROCESS FOR MAKING CHROMIUM MASKS USING SILICON DIOXIDE DRY ETCH MASK

[75] Inventors: Günther Bock, Boeblingen; Bernhard Hafner, Unterjettingen; Reinhold Mühl, Altdorf; Klaus P. Thiel, Weiterstadt, all of Fed. Rep. of Germany

[73] Assignee: International Business Machines Corporation, Armonk, N.Y.

[21] Appl. No.: 524,182

[22] Filed: Aug. 17, 1983

[30] Foreign Application Priority Data

Aug. 25, 1982 [EP] European Pat. Off. ....... 82 107797.1

[51] Int. Cl.³ .......................... G03F 1/00; G03F 7/16; G03F 7/26; B44C 1/22
[52] U.S. Cl. ........................................ 430/5; 156/643; 156/656; 156/659.1; 156/904; 427/255.4; 430/314; 430/315; 430/323; 430/324
[58] Field of Search ............... 430/314, 315, 318, 323, 430/5, 324; 156/643, 656, 659.1, 904; 427/255.4

[56] References Cited

U.S. PATENT DOCUMENTS

| 3,795,557 | 3/1974 | Jacob | 156/8 |
| 4,132,586 | 1/1979 | Schaible et al. | 156/643 |
| 4,184,909 | 1/1980 | Chang et al. | 156/643 |

Primary Examiner—Richard L. Schilling
Attorney, Agent, or Firm—George O. Saile

[57] ABSTRACT

On a substrate (1) covered with a chromium layer (2), a positive resist layer (3) is applied, exposed through an exposure mask with the mask pattern corresponding to the negative of the respective chromium pattern, developed, and blanket-coated with a less than or equal to 10 nm thick layer (4) of silicon dioxide. Then photoresist layer (3) and the silicon layer (4) thereon are lifted off, and finally the chromium layer (2) is dry-etched, the remaining silicon dioxide layer (4) being used as an etch mask.

Chromium masks are used e.g. in the production of semiconductor circuits. By means of the reverse process, structures whose smallest dimensions are in the micrometer and the submicrometer range can be transferred into chromium layers with sharp edges.

11 Claims, 4 Drawing Figures

4,489,146

REVERSE PROCESS FOR MAKING CHROMIUM MASKS USING SILICON DIOXIDE DRY ETCH MASK

DESCRIPTION

1. Technical Field

The invention relates to a reverse process for making chromium masks, where onto a transparent substrate coated with a chromium layer a positive photoresist layer, in the following called positive resist, is applied, subsequently exposed through an exposure mask, developed, and blanket-coated with a layer of a material which is dry-etched more slowly than chromium, where subsequently the photoresist layer and its superimposed material is removed, and finally the chromium is dry-etched, the remaining layer being used as an etch mask.

2. Background Art

A reverse process is a process where the negative of the pattern of openings in an exposure mask is photolithographically etched out of a layer which consists e.g. of chromium. Chromium masks are used e.g. in semiconductor technology to transfer metallization patterns or patterns of diffusion windows photolithographically onto semiconductor substrates.

Reverse processes are of importance e.g. in those cases where for some reason or other the negative and the positive of a mask pattern are required. This applies to those cases where means must be provided to permit the production of a metallization pattern both by an additive and by a subtractive process. A reverse process is of importance also in those cases where it is more economical to make the negative instead of the positive of a mask pattern. To give an example? modern masks are usually produced with a pattern generator with which a program-controlled exposure beam exposes a photoresist layer on the mask material in those places where the photoresist and subsequently in an etching process the mask material are to be removed. If the mask pattern to be generated is of such a type that the overall surface of mask openings amounts to more than 50% of the overall mask surface it saves time to produce not the desired pattern of openings but its negative by means of the pattern generator, and to effect with the use of the mask the transfer of the desired pattern by means of a reverse process.

According to prior art, reverse processes are particularly carried out in such a manner that a mask representing the desired mask pattern is made either by reverse copying using photoemulsion plates of a mask representing the desired mask pattern, or by using the masks representing the desired mask pattern in connection with negative photoresists, in the following called negative resists. The disadvantage of reverse copying is that with respect to apparatus and material it is very complex, and that it involves the risk that the pattern to be produced is adulterated by dust particles that cannot be entirely excluded, in that either the emulsion layer is damaged, or in that the particles act like a mask during exposure. Reverse copying as well as the use of negative resist always include changed dimensions, and blurred edges. This is the reason for the fact that in large-scale production reverse copying as well as the use of negative resist no longer permit a transfer of very small pattern elements—the lower limit of transferrable dimensions is approximately 2 $\mu$m (in the case of positive resist the possible resolution is limited merely by the radiation and apparatus used).

In other words this means that with the increasing trend toward higher packing densities and smaller dimensions the above-mentioned methods are continuously getting less suitable. Compared with positive resists, negative resists have the added disadvantage that their storage lifetime is short due to their oxygen sensitivity.

U.S. Pat. No. 4,132,586 describes a process of obtaining a contrast reversal which does not require a reverse copying of the exposure mask, or the use of negative resists. In this process, a positive resist layer is applied on a substrate covered with a metal layer, e.g. chromium, exposed through an exposure mask showing a pattern of opening corresponding to the negative of the pattern to be etched in the metal layer, developed, and blanket-coated with a magnesium oxide layer. Subsequently, the photoresist and the magnesium oxide thereon are lifted off and finally the chromium is removed by means of reactive ion etching, the still existing magnesium oxide being used as an etch mask. The magnesium oxide layer is 200 nm thick. Although the method of the U.S. patent does not comprise a reverse copying, and although no negative resists are used, the pattern transfer nevertheless involves changed dimensions—owing to the relatively high layer thickness of the magnesium oxide mask—and there is no high quality edge sharpness. For that reason, the method described in the U.S. patent does not fully come up to the demands made to a method for transferring very densely packed patterns with partly very small pattern elements. Besides, the adhesion of the magnesium oxide layer on the metal is not fully satisfactory.

It is the object of the invention to provide an uncomplicated and reliable reverse process for making chromium masks, with which patterns of very high edge sharpness and with high imaging precision can be transferred also in those cases where the pattern elements have dimensions in the micrometer and submicrometer range.

SUMMARY OF THE INVENTION

The reverse process can be applied to the production of chromium masks whose mask patterns comprise structural elements whose smallest dimensions are within the range of the optical resolution limit (approximately 0.5 $\mu$m). The method is furthermore characterized in that the density of the produced defects is extremely low. There is furthermore the surprising effect that the silicon dioxide adheres excellently to the chromium, and that even very thin $SiO_2$-layers have excellent etching mask properties. For the given reasons, the reverse process according to the invention is highly suitable for the transfer of mask patterns used in the production of closely packed highly integrated semiconductor circuits.

The chromium is advantageously etched by means of plasma etching. In that connection, it is advantageous to operate in an atmosphere containing oxygen and chlorinated hydrocarbons at a volume ratio of 1:1. Under these conditions the etching rate of the silicon dioxide is negligible. If the percentage of the chlorinated hydrocarbons in the etching medium amounts to 90 vol.% trichloroethylene and 10 vol.% dichloroethylene no removal of silicon dioxide can be observed.

For further advantageous embodiments of the reverse process according to the invention reference is made to the subclaims.

BRIEF DESCRIPTION OF THE DRAWINGS

In the following, the invention will be described with reference to drawings illustrating embodiments. The drawings show the following.

DETAILED DESCRIPTION OF THE INVENTION

In the following, the production of the chromium mask as disclosed by the invention will be described with reference to FIGS. 1 to 4.

Figure 1:
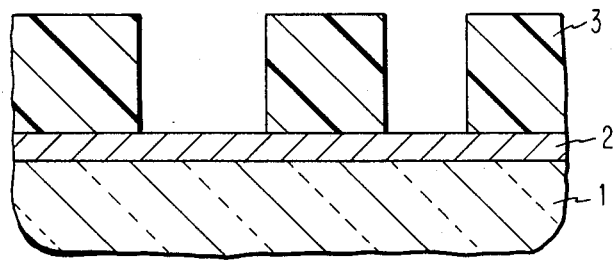
FIGS. 1 to 4 in schematic cross-sectional views the production of the mask according to the invention in various stages of its manufacture.

The structure shown in a cross-section in FIG. 1 consists of a substrate 1 made e.g. of soda-lime glass or quartz glass, superimposed by a chromium layer 2 with a thickness in the order of 100 nm and showing a pattern 3 of a positive photoresist representing the negative of the respective mask pattern. The photoresist pattern 3 is made by means of conventional photolithographic process steps. Suitable positive resist materials are e.g. phenolformaldehyde-resins (novolak) with a diazonaphtoquinone sensitizer. Advantageous examples for these positive resist materials are those marketed by Shipley Co. Inc, Newton, Mass., United States of America under the trade name AZ-1350 H, AZ-1350 J and AZ-1450 B.

Figure 2:
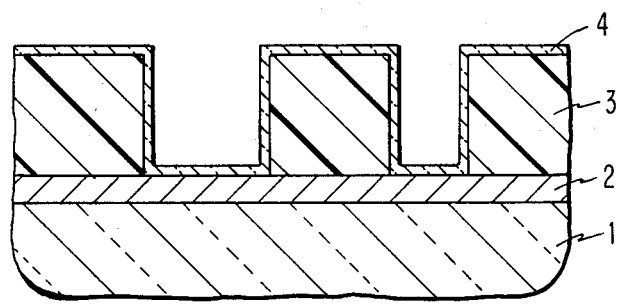
Figure 3:
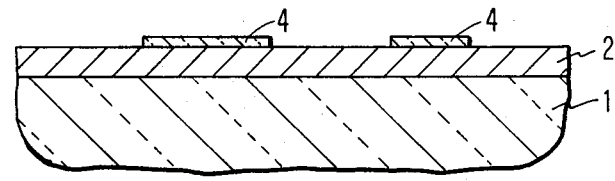

Onto the structure of FIG. 1, a less than or equal to 10 nm thick silicon dioxide layer 4 is blanket-deposited. FIG. 2 is a cross-section of the thus obtained structure. Silicon dioxide layer 4 can be applied by means of cathode sputtering, or chemical vapor deposition. Silicon dioxide layer 4 adheres excellently to chromium layer 2. This seems to be due to the fact that under the conditions of application there forms a layer structure of a few nm thickness only which consists of a chromium oxide layer on chromium layer 2, a superimposed oxide layer containing chromium and silicon, and a top silicon dioxide layer. Subsequently a photoresist pattern 3 and the sectors of silicon dioxide layer 4 thereupon are lifted off. For that purpose, the structure is immersed into a medium dissolving the photoresist. Suitable materials are a mixture used at 90° to 100° C. which is marketed by a Indust-Ri-Chem. Laboratory, Richardson, Tex. under the trade name J-100, and Caro acid used at room temperature. J-100 contains 22.5 to 23.9% by weight non-volatile components consisting partly of the sodium salt of the alkylnaphtalene sulphonic acid and the free alkylnaphtalene sulphonic acid. The volatile part of the mixture contains 44.5 tetrachloroethylene, 37% by weight o-dichlorobenzene, 0.8% by weight p-dichlorobenzene, and 17.6% by weight phenol. The J-100 treatment takes approximately 40 minutes. Advantageous results are obtained with Caro acid which is obtained as a result of the mixing of 11 96% sulphonic acid and 45 ml 85% hydrogen peroxide. The processing with this Caro acid takes approximately 10 minutes. Under the process conditions, the action of the J-100 or the Caro acid on the photoresist is not substantially inhibited by quartz layer 4. In the structure of FIG. 3, silicon dioxide layer 4 is formed in accordance with the desired mask pattern.

Figure 4:
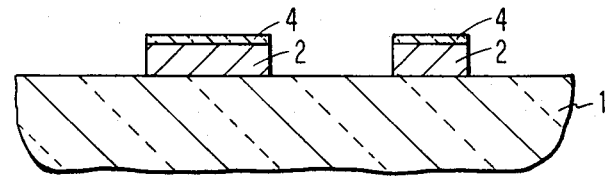

In the following process step, chromium layer 2 is selectively removed by means of plasma etching, with silicon dioxide layer 4 being used as an etch mask. Plasma etching is suitably effected by means of an apparatus as described e.g. in U.S. Pat. No. 3,795,557. In this plasma etching device, the parts to be etched are arranged in a horizontal cylindrical vessel covered with a gas-tight lid, and having at least one gas inlet for the reactive gases, and one gas outlet connected to a vacuum pump. Wound on the outer surface of the cylindrical vessel a coil connected to an RF generator is provided supplying the energy necessary to maintain a plasma in the reaction vessel. As a reaction gas, a mixture of oxygen and chlorinated hydrocarbons is used, preferably a mixture of 90 vol.% $C_2HCl_3$ and 10 vol.% $C_2H_2Cl_2$. For etching chromium layer 2 with a thickness in the order of 100 nm approximately 20 minutes are required. Under the given reaction conditions the silicon dioxide is practically not affected at all. FIG. 4 depicts the result of the plasma etching in a cross-section. Chromium pattern 2 represents the negative of photoresist pattern 3 of FIG. 1. Owing to the low thickness of silicon dioxide layer 4 the negative of photoresist pattern 3 depicted in FIG. 1 can be transferred into chromium layer 2 with maximum imaging precision and a very high edge sharpness. Silicon dioxide layer 4 left on chromium pattern 2 can remain there, acting as a protection against mechanical damages to the chromium.

In the following, the production of the mask according to the invention will be described in greater detail with reference to an embodiment.

Starting with a plate of soda lime glass covered with a blanket chromium layer approximately 100 nm thick, an AZ-1350 H layer approximately 400 nm thick is spin-coated onto the chromium layer. This is followed by the conventional photolithographic process steps, i.e. drying and pre-heating of the photoresist layer, its exposure by means of a mercury high pressure lamp through a mask with a mask pattern corresponding to the negative of the desired pattern in the chromium layer, and its development in an aqueous KOH-solution. Without a subsequent heat treatment, the chromium-coated glass plate covered with the photoresist is then placed into a cathode sputtering device. This device is a conventional cathode sputtering device comprising two horizontally arranged planar electrode plates parallel to each other, the lower electrode being provided to receive the substrates to be coated, and the upper electrode having on its side facing the lower electrode the target plate consisting of silicon dioxide. The cathode sputtering system used belongs to the category of directly driven anode systems. At the beginning of cathode sputtering, the pressure in the cathode sputtering chamber is less than $2 \times 10^{-2} \mu$ bar. Then argon is passed through the chamber with a flow speed of 100±5 ml/min. The operating pressure is approximately 30μ bar. The overall radio frequency power (13 nHz) is at 0.8 kW approximately. A voltage of 2800 V is applied to the cathode, and a bias of 600 V is applied to the anode. Under the given conditions, the silicon dioxide is deposited with a speed of approximately 0.2 nm/sec, i.e. it takes between 40 and 60 seconds to apply on the structure an approximately 10 nm thick silicon dioxide layer. In the subsequent process step, the photoresist and the silicon dioxide layer thereon are lifted off in that the entire structure is processed in a vessel containing J-100 heated to 90° to 100° C. There follows an intensive cleaning process with an aqueous alkaline solution and water. After drying, the chromium-coated glass plate covered with the quartz layer in accordance with the respective pattern is placed into the plasma etched device marketed by LFE-Corp. Waltham, Mass. U.S.A. under the designation LFE-(PFS/PCrE/PDS)-501.

The pressure in the plasma etching chamber is set to a value of approximately 0.33μ bar. The etching process is effected with a mixture of chlorinated hydrocarbons and oxygen at a volume ratio of 1:1, with 90 vol.% of the hydrocarbon consisting of trichlorethylene, and 10 vol.% of dichloroethylene. The gas flow quantity amounts to 12.5 ml/min. The operation takes place at a high frequency of 13.5 MHz, with a power of 350 Watt. For selectively etching off the approximately 100 nm thick chromium layer a period between 18 and 20 minutes is required. With the given mask producing method, pattern elements in the mask with dimensions approaching the optical limit of resolution (approximately 0.5 μm) could be perfectly transferred into the chromium layer. The chromium mask produced was furthermore of excellent edge sharpness. While the invention has been particularly shown and described with reference to the preferred embodiments thereof, it will be understood by those skilled in the art that various changes in form and detail may be made therein without departing from the spirit and scope thereof.

What is claimed is:

1. A reverse process for making a chromium mask comprising:
   providing a substrate coated with a chromium layer;
   applying a layer of positive resist onto the chromium layer;
   exposing the said resist through an exposure mask, developing the resist and removing the unwanted portions thereof;
   blanket coating by cathode sputtering a layer of a silicon dioxide material which is dry-etched more slowly than said chromium layer;
   said conditions of said cathode sputtering is such that a layer of chromium oxide in the order of nanometers in thickness forms between said chromium layer and said silicon dioxide layer resulting in superior adherence between the said chromium and silicon dioxide layers;
   lifting off said blanket-coating layer where it is upon said resist and leaving the said blanket-coating where it is upon said chromium layer; and
   dry etching said chromium layer while using the remaining said blanket-coating layer as an etch mask to form said chromium mask.

2. The reverse process of claim 1 wherein the said silicon dioxide layer is less than about 10 nm thick.

3. The reverse process of claim 1 wherein said cathode sputtering is carried out in an argon atmosphere.

4. The reverse process of claim 3 wherein said dry etching takes place at an operating pressure of approximately 30μ bar, an overall radio frequency power of about 0.8 kW, a cathode voltage of about 2800 V, an anode bias of about 600 V, and an argon flow of approximately 100 ml/min.

5. The reverse process of claim 1 wherein the said chromium layer is etched by means of plasma etching.

6. The reverse process of claim 5 wherein said etching takes place in a atmosphere containing chlorinated hydrocarbons and oxygen.

7. The reverse process of claim 6 wherein the said chlorinated hydrocarbon part in the gaseous atmosphere is composed of 90 vol. % trichloroethylene and 10 vol. % dichloroethylene.

8. The reverse process of claim 7 wherein said etching takes place at a power of 300 to 350 Watts, an etching gas flow of approximately 12.5 ml/min. and a pressure of approximately 0.33μ bar.

9. A reverse process for making a chromium mask comprising:
   providing a substrate coated with a chromium layer;
   applying a layer of positive resist onto the chromium layer;
   exposing the said resist through an exposure mask, developing the resist and removing the unwanted portions thereof;
   blanket coating by chemical vapor deposition a layer of a silicon dioxide material which is dry-etched more slowly than said chromium layer;
   said conditions of said chemical vapor deposition is such that a layer of chromium oxide in the order of nanometers in thickness forms between said chromium layer and said silicon dioxide layer resulting in superior adherence between the said chromium and silicon dioxide layers;
   lifting off said blanket-coating layer where it is upon said resist and leaving the said blanket-coating where it is upon said chromium layer; and
   dry etching said chromium layer while using the remaining said blanket-coating layer as an etch mask to form said chromium mask.

10. The reverse process of claim 9 wherein the said chromium layer is etched by means of plasma etching.

11. The reverse process of claim 10 wherein said etching takes place in a atmosphere containing chlorinated hydrocarbons and oxygen.

* * * * *